(12) United States Patent
Fukaya

(10) Patent No.: US 9,514,973 B2
(45) Date of Patent: Dec. 6, 2016

(54) LID-OPENING/CLOSING DEVICE

(71) Applicant: MURATA MACHINERY, LTD., Kyoto-shi, Kyoto (JP)

(72) Inventor: Noriyasu Fukaya, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 135 days.

(21) Appl. No.: 14/407,195

(22) PCT Filed: Apr. 17, 2013

(86) PCT No.: PCT/JP2013/061400
§ 371 (c)(1),
(2) Date: Dec. 11, 2014

(87) PCT Pub. No.: WO2013/187121
PCT Pub. Date: Dec. 19, 2013

(65) Prior Publication Data
US 2015/0170949 A1    Jun. 18, 2015

(30) Foreign Application Priority Data

Jun. 14, 2012  (JP) .................................. 2012-134831

(51) Int. Cl.
*H01L 21/673* (2006.01)
*H01L 21/677* (2006.01)
(52) U.S. Cl.
CPC ... *H01L 21/67772* (2013.01); *H01L 21/67373* (2013.01); *H01L 21/67769* (2013.01); *H01L 21/67775* (2013.01); *B65D 2585/86* (2013.01)
(58) Field of Classification Search
CPC .............................................. H01L 21/67772
See application file for complete search history.

(56) References Cited

U.S. PATENT DOCUMENTS

| 4,746,256 A | 5/1988 | Boyle et al. |
| 5,743,424 A | 4/1998 | Murata et al. |

(Continued)

FOREIGN PATENT DOCUMENTS

| JP | 3180600 B2 | 6/2001 |
| JP | 2003-168729 A | 6/2003 |

(Continued)

OTHER PUBLICATIONS

Official Communication issued in International Patent Application No. PCT/JP2013/061400, mailed on Jun. 11, 2013.

(Continued)

*Primary Examiner* — Michael McCullough
*Assistant Examiner* — Mark Hageman
(74) *Attorney, Agent, or Firm* — Keating & Bennett, LLP

(57) ABSTRACT

A lid-opening/closing device includes a device body, a lock-opening/closing mechanism, and a container-securing unit. A pod including a container body, a lid portion defining a bottom portion that is openable and closable with respect to the container body, and a locking mechanism performing unlocking and locking of the lid portion with respect to the container body is placed on the device body. The lock-opening/closing mechanism performs unlocking operation to cause the locking mechanism to perform the unlocking, and performs locking operation to cause the locking mechanism to perform the locking by moving an engaging portion configured to engage with the locking mechanism when the pod is placed on the device body. The container-securing unit secures the container body to the device body in conjunction with the lock-opening/closing mechanism when the locking mechanism is caused to perform the unlocking.

2 Claims, 13 Drawing Sheets

(56) References Cited

U.S. PATENT DOCUMENTS

| | | | |
|---|---|---|---|
| 6,152,669 A * | 11/2000 | Morita | H01L 21/67772 414/217 |
| 6,160,265 A * | 12/2000 | Bacchi | H01L 21/67373 250/559.29 |
| 6,984,097 B1 * | 1/2006 | Saeki | H01L 21/50 257/E21.499 |
| 2008/0035237 A1 | 2/2008 | Pan | |
| 2012/0042988 A1 | 2/2012 | Shikata et al. | |
| 2013/0043776 A1 | 2/2013 | Wu | |

FOREIGN PATENT DOCUMENTS

| | | |
|---|---|---|
| JP | 2007-173265 A | 7/2007 |
| WO | 2010/131414 A1 | 11/2010 |

OTHER PUBLICATIONS

English translation of Official Communication issued in corresponding International Application PCT/JP2013/061400, mailed on Dec. 24, 2014.

Official Communication issued in corresponding European Patent Application No. 13804692.5, mailed on Jan. 12, 2016.

\* cited by examiner

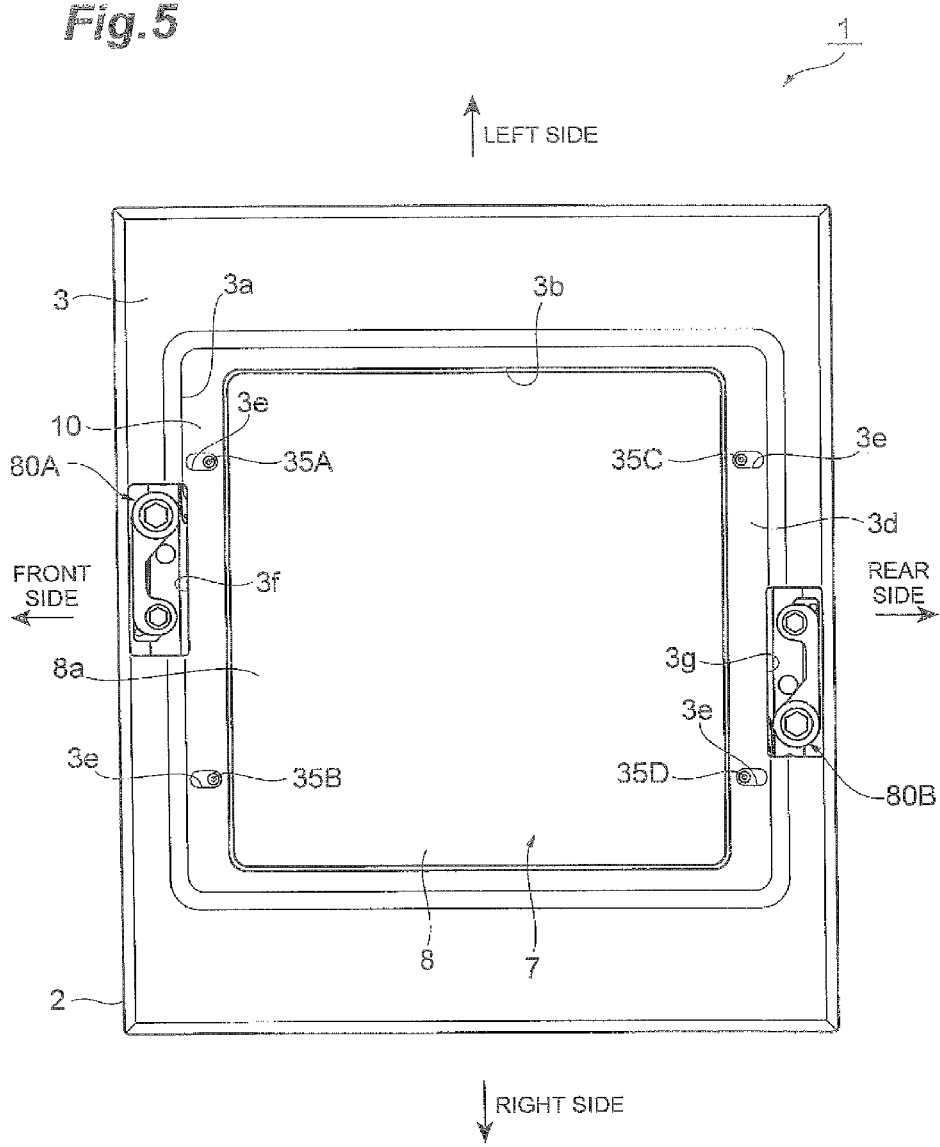

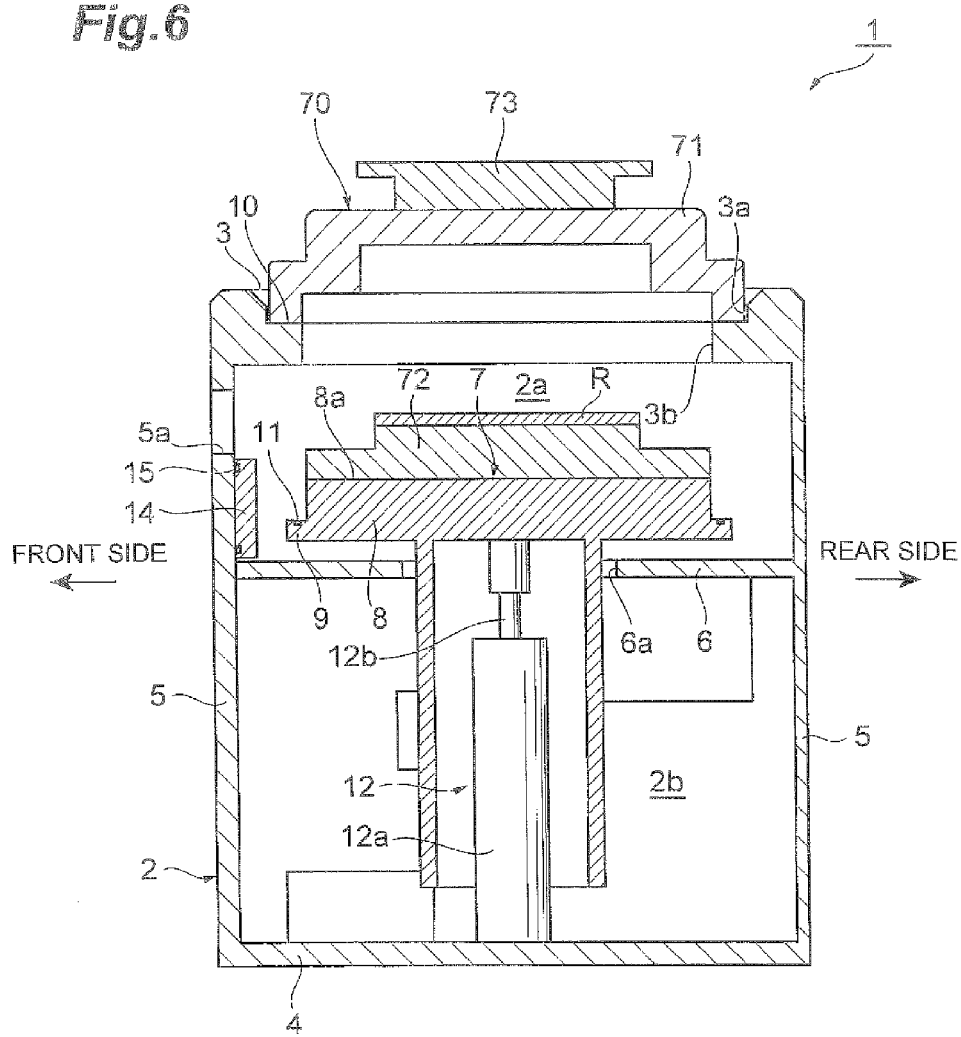

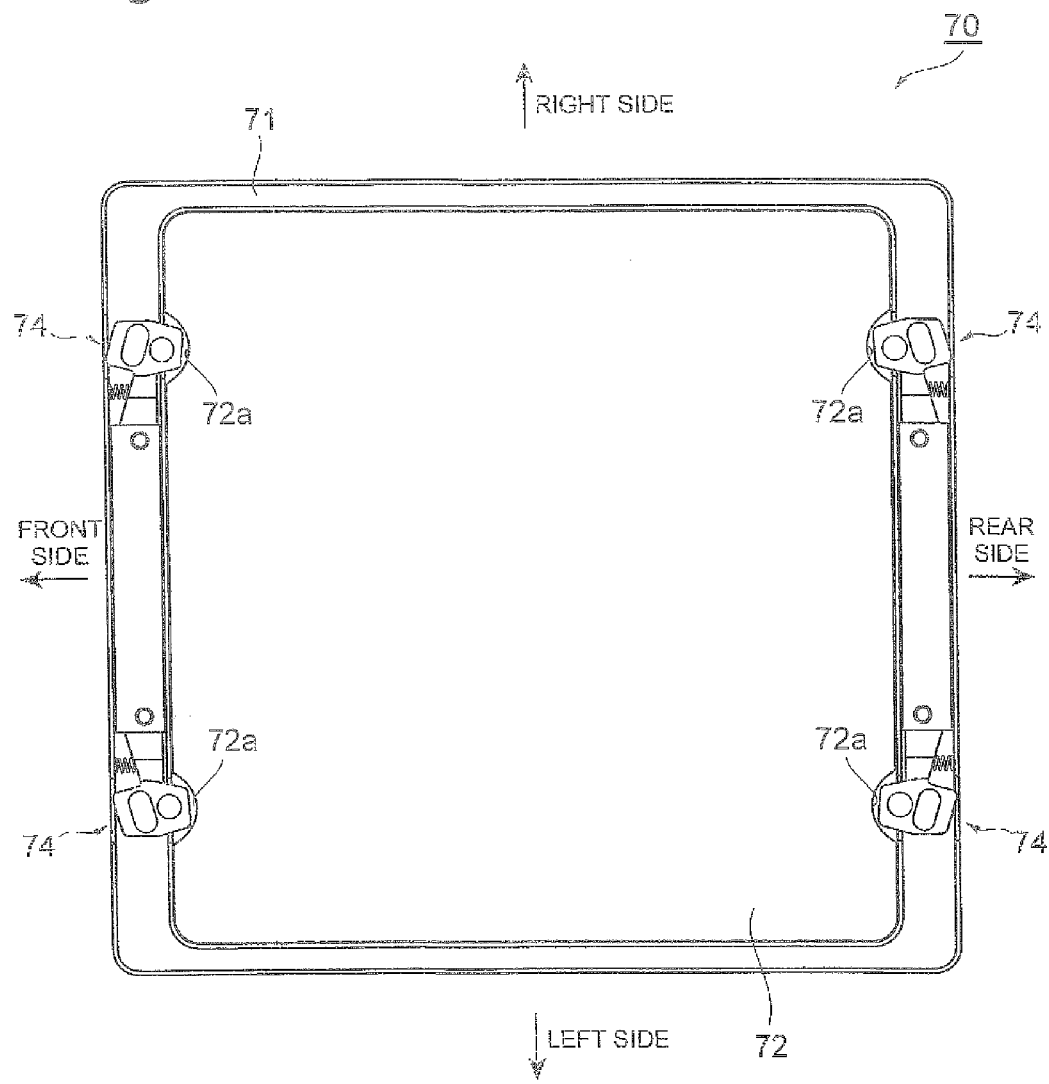

LID-OPENING/CLOSING DEVICE

BACKGROUND OF THE INVENTION

1. Field of the Invention

The present invention relates to a lid-opening/closing device that opens and closes a lid portion with respect to a container body in a storage container that stores therein an object to be stored.

2. Description of the Related Art

In a clean room of a factory manufacturing semiconductor devices or liquid crystal displays, for example, semiconductor wafers or glass substrates, for example, are conveyed while being stored in a storage container. Accordingly, when such objects to be stored are transferred between the storage container and each device, a lid portion needs to be opened and closed with respect to a container body by a lid-opening/closing device. To quickly and stably open and close such a lid portion with respect to a container body, various techniques have been proposed (see Japanese Patent No. 3180600, for example) in which, for example, a lid-opening/closing device is provided with a pressure-equalizing mechanism for equalizing pressures between the interior and the exterior of a storage container.

Because such a factory manufacturing semiconductor devices or liquid crystal displays described above urgently needs improvement in the efficiency of conveying various parts, improving the efficiency of transferring objects to be stored between storage containers and various devices is also very important.

SUMMARY OF THE INVENTION

In view of this, preferred embodiments of the present invention provide a lid-opening/closing device that accurately attaches a lid portion to a container body.

A lid-opening/closing device according to one aspect of various preferred embodiments of the present invention is a lid-opening/closing device for a storage container provided with a container body storing therein an object to be stored, a lid portion defining a bottom portion that is openable and closable with respect to the container body and on which an object to be stored is placed, and a locking mechanism configured to perform unlocking and locking of the lid portion with respect to the container body, the lid-opening/closing device being configured to open and close the lid portion with respect to the container body and including a device body on which the storage container is placed; a moving unit that includes an engaging portion configured to engage with the locking mechanism when the storage container is placed on the device body, and configured to perform an unlocking operation to cause the locking mechanism to perform the unlocking and a locking operation to cause the locking mechanism to perform the locking by moving the engaging portion; and a container-securing unit configured to secure the container body to the device body in conjunction with the moving unit when the locking mechanism is caused to perform the unlocking.

In the lid-opening/closing device, when the locking mechanism is caused to perform the unlocking by moving the moving unit, the container-securing unit secures the container body to the device body in conjunction with the moving unit. Because the container body is secured to the device body in conjunction with the unlocking operation of the locking mechanism in this manner, for example, even if the lid portion is attached when the locking mechanism is in an unlocked state, lifting of the container body and positional misalignment of the lid portion, for example, is prevented from occurring. Thus, this lid-opening/closing device enables the lid portion to be accurately attached to the container body.

It is preferable that the moving unit include a plurality of rotating members each of which: includes the engaging portion, is rotatably supported by the device body, and is configured to move the engaging portions; a connecting member configured to connect at least a pair of the rotating members and rotate the pair of rotating members; and an actuator that is attached to the device body and is configured to impart a driving force to the connecting member; and the container-securing unit is linked with movement of the connecting member.

With this configuration, by using the connecting member to connect at least a pair of the rotating members, engaging portions provided to the pair of rotating members are operated at the same timing. This makes it possible to simultaneously perform the unlocking operation and the locking operation of a plurality of locking mechanisms that are provided corresponding to the engaging portions of the rotating members. Accordingly, lifting of the container body and positional misalignment of the lid portion, for example, due to variations in the unlocking operation and the locking operation of the locking mechanisms are prevented from occurring. Thus, this lid-opening/closing device enables the lid portion to be more accurately attached to the container body.

It is preferable that the container-securing unit include a pressing member configured to press the container body and a biasing member configured to bias the pressing member toward the container body; and the moving unit includes a linkage member configured to separate the pressing member from the container body in a direction against a biasing force of the biasing member when the locking operation is performed, and is configured to allow the biasing member to bias the pressing member when the unlocking operation is performed.

With this configuration, when the container body is secured, the pressing member can be pressed against the container body by using the biasing force of the biasing member, which eliminates the necessity of special actuators, for example, for securing the container body, and thus the device configuration can be simplified.

It is preferable that the container-securing unit further include a lever portion including a base-end side rotatably supported by the device body and a leading-end side that is movable; the pressing member includes an elastic roller configured to elastically abut the container body and be rotatably attached to the leading-end side of the lever portion; the biasing member includes a spring configured to bias the leading-end side of the lever portion; and the linkage member includes a cam follower that is fixed in a position on the connecting member where the linkage member is capable of abutting on and separating from the lever portion in connection with the movement of the connecting member and rotates the lever portion. With this configuration, by using the container-securing unit as a rotatable lever portion and rotating the lever portion by the cam follower, the operation of pressing the elastic roller against the container body and operation of releasing this pressing is performed in conjunction with the movement of the moving unit. This eliminates the necessity of special actuators, for example, for rotating the lever portion, and thus the device configuration is greatly simplified and power savings are achieved.

Various preferred embodiments of the present invention enable a lid-opening/closing device to be provided that accurately attaches a lid portion to a container body.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a plan view of the lid-opening/closing device of FIG. 4.

FIG. 6 is a longitudinal sectional view of the lid-opening/closing device of FIG. 4 in another state.

FIG. 7 is a bottom view of a pod the lid portion of which is opened and closed by the lid-opening/closing device of FIG. 4.

DETAILED DESCRIPTION OF THE PREFERRED EMBODIMENTS

Figure 1:
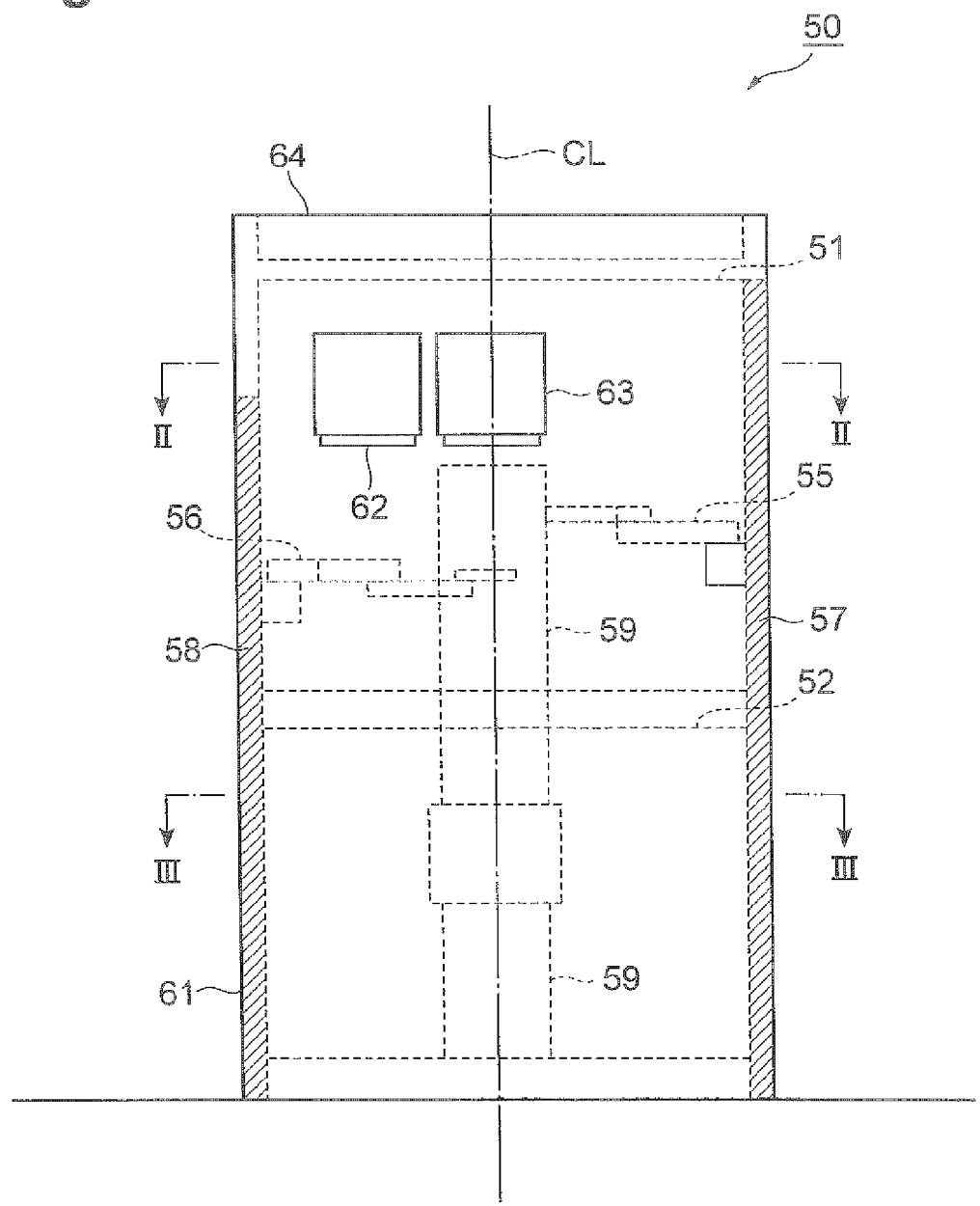
FIG. 1 is a front view of a storage cabinet including a lid-opening/closing device according to a preferred embodiment of the present invention.

Preferred embodiments of the present invention will be described hereinafter in detail with reference to the drawings. In the drawings, like reference signs indicate like or corresponding components, and duplicate description is omitted.

Figure 2:
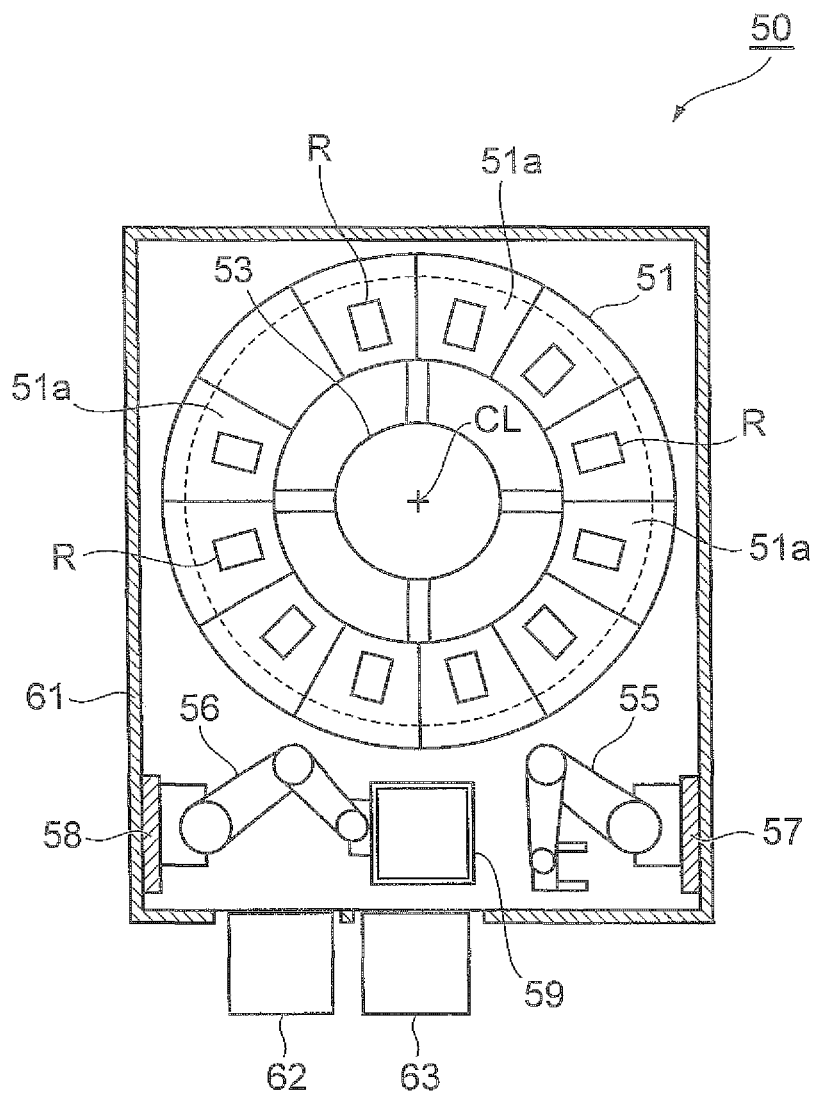
FIG. 2 is a sectional view of the storage cabinet along line II-II of FIG. 1.
Figure 3:
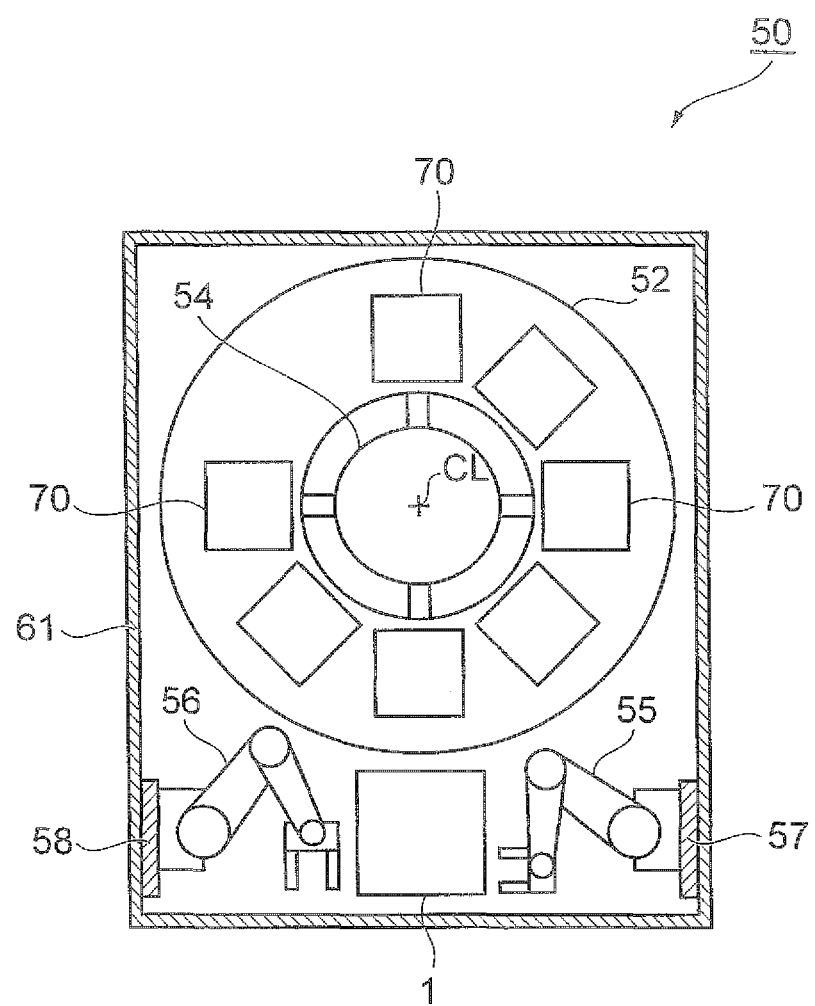
FIG. 3 is a sectional view of the storage cabinet along line III-III of FIG. 1.

FIG. 1 is a front view of a storage cabinet including a lid-opening/closing device according to a preferred embodiment of the present invention. FIG. 2 is a sectional view of the storage cabinet along line II-II of FIG. 1. FIG. 3 is a sectional view of the storage cabinet along line III-III of FIG. 1. As depicted in FIGS. 1 to 3, this storage cabinet 50 includes a reticle-specific rotating rack 51 and a pod-specific rotating rack 52. The reticle-specific rotating rack 51 stores therein a plurality of reticles R each of which preferably has a rectangular or substantially rectangular plate shape and is used when a semiconductor wafer or a glass substrate, for example, is exposed to light to forma predetermined pattern on the surface thereof. The pod-specific rotating rack 52 stores therein a plurality of pods 70 for storing therein and conveying the reticles R in an empty state. The pods 70 configured to store the reticles R each typically have a configuration according to the SEMI standard that is an international standard for semiconductors, for example.

These storage cabinets 50 are installed in a clean room of a factory manufacturing semiconductor devices or liquid crystal displays, for example.

The reticle-specific rotating rack 51 is rotated around an axis line CL by a driving unit 53. The reticle-specific rotating rack 51 includes a plurality of blocks 51a that are arranged along the rotating direction. The respective blocks 51a are configured to be able to store the reticles R on a plurality of shelves provided therein one above another. The pod-specific rotating rack 52 is rotated around the axis line CL by the driving unit 54 below the reticle-specific rotating rack 51. The pod-specific rotating rack 52 is configured to be able to store therein the pods 70 along the rotating direction.

The storage cabinet 50 further includes a reticle conveying device 55, a pod conveying device 56, and the lid-opening/closing device 1. The reticle conveying device 55 is a robot arm that ascends and descends along an elevating guide 57, and conveys the reticles R between the lid-opening/closing device 1 and the reticle-specific rotating rack 51. The pod conveying device 56 is a robot arm that ascends and descends along an elevating guide 58, and conveys the pods 70 being empty between the lid-opening/closing device 1 and the pod-specific rotating rack 52. The lid-opening/closing device 1 is a device called a pod opener, and opens and closes the pods 70. Near the lid-opening/closing device 1, a pod-specific stationary rack 59 is installed and configured to temporarily store therein the pods 70 storing therein the reticles R and the pods 70 being empty.

The rotating racks 51 and 52, the driving units 53 and 54, the conveying devices 55 and 56, the stationary rack 59, and the lid-opening/closing device 1 are arranged in a casing 61. The casing 61 is provided with ports 62 and 63 through which an overhead traveling vehicle, for example, has access. The pods 70 storing therein the reticles R are put into the casing 61 through the port 62, and the pods 70 storing therein the reticles R are taken out of the casing 61 through the port 63.

On an upper wall of the casing 61, a clean-gas supplying device 64 is installed. The clean-gas supplying device 64 supplies clean gas such as clean air or nitrogen as a downflow into the casing 61. The clean gas supplied into the casing 61 is discharged out of the casing 61 from a lower portion of the casing 61.

The following describes operation of the storage cabinet 50 when a pod 70 storing therein a reticle R is put in. After the pod 70 is conveyed to the port 62 by an overhead traveling vehicle, for example, the pod 70 is conveyed to the lid-opening/closing device 1 by the pod conveying device 56. After the pod 70 is conveyed to the lid-opening/closing device 1, the reticle R stored in the pod 70 is stored in the reticle-specific rotating rack 51 by the reticle conveying device 55. Then, the empty pod 70 that is left in the lid-opening/closing device 1 is stored in the pod-specific rotating rack 52 by the pod conveying device 56. When a plurality of pods 70 are consecutively put into the casing 61, the pods 70 are temporarily stored in the pod-specific stationary rack 59, and are sequentially conveyed to the lid-opening/closing device 1.

The following describes operation of the storage cabinet 50 when a pod 70 storing therein a reticle R is taken out. After a reticle R is conveyed from the reticle-specific rotating rack 51 to the lid-opening/closing device 1 by the reticle conveying device 55, the reticle R is stored in an empty pod 70 that is conveyed from the pod-specific rotating rack 52 to the lid-opening/closing device 1 by the pod conveying device 56. The pod 70 storing therein the reticle R is conveyed from the lid-opening/closing device 1 to the port 63 by the pod conveying device 56, and is conveyed from the port 63 to a predetermined destination by an overhead traveling vehicle, for example. When a plurality of pods 70 are consecutively taken out of the casing 61, the pods 70 are temporarily stored in the pod-specific stationary rack 59, and are sequentially conveyed to the port 63.

Figure 4:
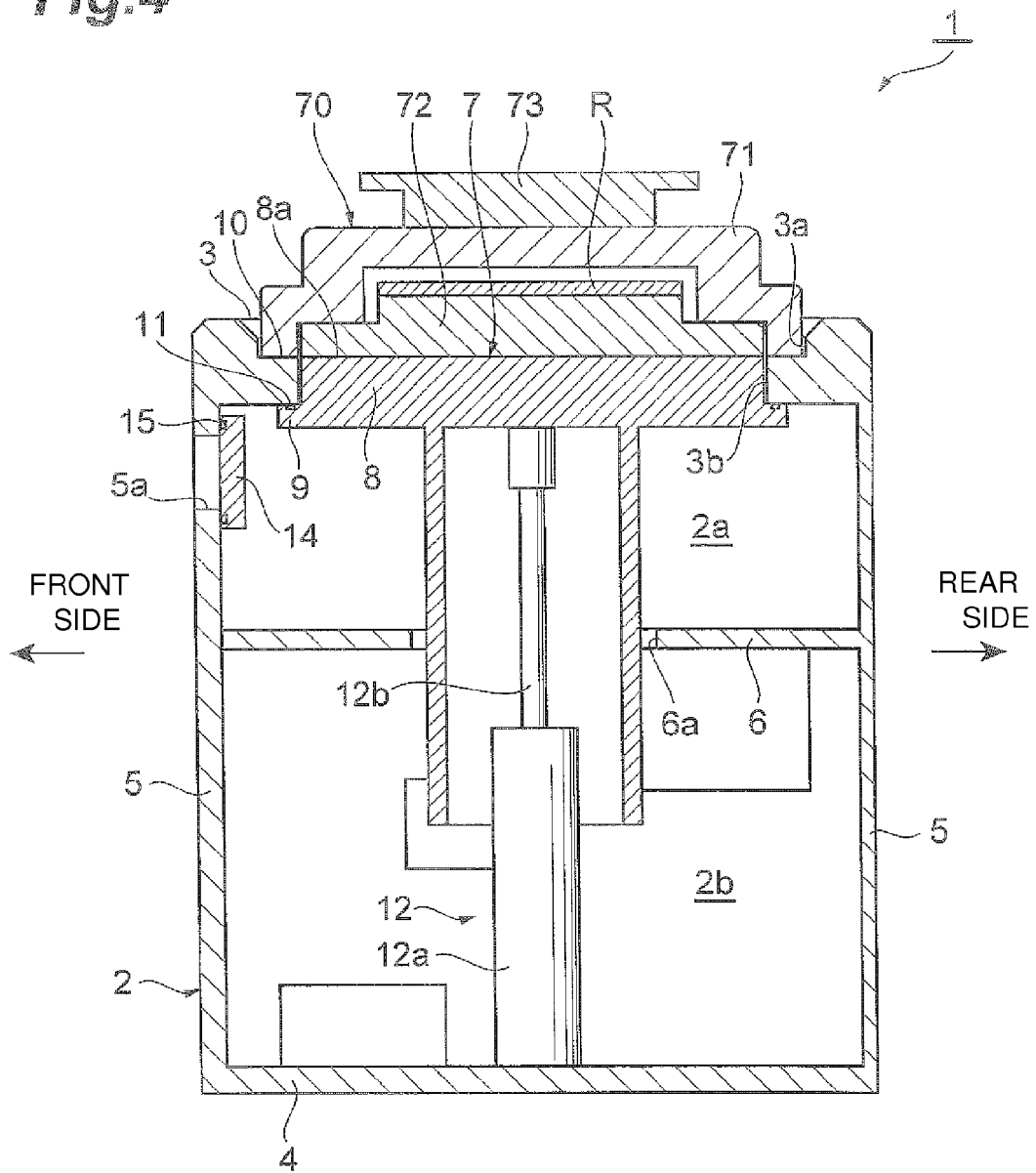
FIG. 4 is a longitudinal sectional view of the lid-opening/closing device according to a preferred embodiment of the present invention.

FIG. 4 is a longitudinal sectional view of the lid-opening/closing device of a preferred embodiment of the present invention, and FIG. 5 is a plan view of the lid-opening/closing device of FIG. 4. In the following description, the side through which the reticles R are loaded into and unloaded from the lid-opening/closing device 1 is referred to as "front side", and the opposite side is referred to as "rear side". The left side of the lid-opening/closing device 1 in an erect state when seen from the front side is simply referred to as "left side", and the right side of the lid-opening/closing device 1 in the erect state when seen from the front side is simply referred to as "right side".

As depicted in FIGS. 4 and 5, the lid-opening/closing device 1 includes a device body 2 preferably having a shape of a rectangular or substantially rectangular parallelepiped box. The device body 2 preferably includes an upper wall 3, a lower wall 4, side walls 5, and a partition 6. The inner space of the device body 2 is divided by the partition 6 into a reticle load/unload area 2a and an apparatus installation area 2b that are arranged one above the other. However, the reticle load/unload area 2a and the apparatus installation area 2b are communicated with each other in an area on the left side and in an area on the right side of the partition 6. The upper wall 3 is provided with a recessed portion 3a preferably having a rectangular or substantially rectangular cross-section, and the bottom surface of the recessed portion 3a is provided with an opening 3b preferably having a rectangular or substantially rectangular, for example. The bottom surface of the recessed portion 3a defines and serves as a placement surface 10 on which a pod (storage container) 70 conveyed by the pod conveying device 56 is placed. The pod 70 includes a container body 71 that preferably has a rectangular or substantially rectangular parallelepiped box and stores therein a reticle (object to be stored) R and a lid portion 72 that preferably has a rectangular or substantially rectangular plate shape and on which the reticle R is placed, for example. The lid portion 72 defines a bottom portion that is configured to be opened and closed with respect to the container body 71. The top portion of the container body 71 is provided with a held portion 73 that is held by the pod conveying device 56. The lid-opening/closing device 1 is a device that opens and closes the lid portion 72 with respect to the container body 71 for the pod 70 storing therein the reticle R.

In the device body 2, an elevating stage 7 is configured to ascend and descend in the reticle load/unload area 2a. The elevating stage 7 preferably includes a body portion 8 preferably having a rectangular or substantially rectangular plate shape and a flange portion 9 that preferably has a rectangular or substantially rectangular plate shape and is provided to the lower end of the body portion 8. When the elevating stage 7 ascends, the body portion 8 is arranged in the opening 3b, and the flange portion 9 abuts the inner surface of the upper wall 3. At this time, the opening 3b of the upper wall 3 is air-tightly closed with a sealing member 11 that preferably has a rectangular preferably or substantially rectangular ring shape and is provided on the flange portion 9, and the upper surface 8a of the body portion 8 is flush with the placement surface 10 (i.e., the bottom surface of the recessed portion 3a).

In the device body 2, an air cylinder 12 is configured to move the elevating stage 7 up and down. The air cylinder 12 preferably includes a cylinder portion 12a that is fixed on the inner surface of the lower wall 4 and a rod portion 12b the base end of which is inserted into the cylinder portion 12a. The leading end of the rod portion 12b is fixed on the lower surface of the elevating stage 7 through an opening 6a that preferably has a rectangular or substantially rectangular cross-section and is provided at the central portion of the partition 6. In the apparatus installation area 2b in the device body 2, various apparatuses are provided such as an electromagnetic valve configured to control charge and discharge of gas into and from the air cylinder 12. To move up and down the elevating stage 7, a plurality of air cylinders may be used, or another actuator may be used instead of the air cylinder.

The side wall 5 on the front side of the device body 2 is provided with a reticle load/unload port 5a preferably having a rectangular or substantially rectangular cross-section and configured to communicate between the exterior and the reticle load/unload area 2a in the device body 2. The reticle load/unload port 5a is opened and closed from inside by a closing plate 14 that is operated by an actuator such as an air cylinder, for example. When the reticle load/unload port 5a is closed by the closing plate 14, the reticle load/unload port 5a is air-tightly closed with a sealing member 15 that preferably has a rectangular or substantially rectangular ring shape and is provided to the closing plate 14.

The following describes operation of the lid-opening/closing device 1 when a pod 70 storing therein a reticle R is put in. As depicted in FIG. 4, the lid-opening/closing device 1 stands by with the opening 3b of the upper wall 3 air-tightly closed by the elevating stage 7 and with the reticle load/unload port 5a air-tightly closed by the closing plate 14. In this state, after the pod 70 that is conveyed from the port 62 into the lid-opening/closing device 1 by the pod conveying device 56 is placed on the placement surface 10 of the lid-opening/closing device 1, the locking mechanism of the pod 70 is put into the unlock state by the lid-opening/closing device 1 (the detail will be described later).

Subsequently, as depicted in FIG. 6, the elevating stage 7 descends together with the lid portion 72 on which the reticle R is placed, and the reticle R is arranged in the reticle load/unload area 2a. After the closing plate 14 operates to open the reticle load/unload port 5a, the reticle conveying device 55 accesses the reticle load/unload area 2a through the reticle load/unload port 5a to store the reticle R arranged in the reticle load/unload area 2a in the reticle-specific rotating rack 51.

Subsequently, the closing plate 14 operates, so that the reticle load/unload port 5a is air-tightly closed by the closing plate 14. In addition, the elevating stage 7 ascends together with the lid portion 72, so that the opening 3b of the upper wall 3 is air-tightly closed by the elevating stage 7. Then, the locking mechanism of the empty pod 70 placed on the placement surface 10 of the lid-opening/closing device 1 is put into a locked state by the lid-opening/closing device 1 (the detail will be described later). The empty pod 70, the locking mechanism of which is in the locked state, is stored in the pod-specific rotating rack 52 by the pod conveying device 56.

The following describes operation of the storage cabinet 50 when a pod 70 storing therein a reticle R is taken out. As depicted in FIG. 4, the lid-opening/closing device 1 stands by with the opening 3b of the upper wall 3 air-tightly closed by the elevating stage 7 and with the reticle load/unload port 5a air-tightly closed by the closing plate 14. In this state, after an empty pod 70 that is conveyed from the pod-specific rotating rack 52 to the lid-opening/closing device 1 by the pod conveying device 56 is placed on the placement surface 10 of the lid-opening/closing device 1, the locking mechanism of this pod is put into the unlocked state by the lid-opening/closing device 1 (the detail will be described later).

Subsequently, as depicted in FIG. 6, the elevating stage 7 descends together with the lid portion 72, and the lid portion 72 is arranged in the reticle load/unload area 2a. After the closing plate 14 operates to open the reticle load/unload port 5a, the reticle conveying device 55 that has conveyed the reticle R from the reticle-specific rotating rack 51 accesses the reticle load/unload area 2a through the reticle load/unload port 5a to place the reticle R on the lid portion 72 arranged in the reticle load/unload area 2a.

Subsequently, the closing plate 14 operates, so that the reticle load/unload port 5a is air-tightly closed by the closing plate 14. In addition, the elevating stage 7 ascends together with the lid portion 72 on which the reticle R is placed, so that the opening 3b of the upper wall 3 is air-tightly closed by the elevating stage 7. Then, the locking mechanism of the pod 70 placed on the placement surface 10 of the lid-opening/closing device 1 is put into the locked state by the lid-opening/closing device 1 (the detail will be described later). The pod 70 the locking mechanism of which is in the locked state is conveyed to the port 62 by the pod conveying device 56.

Prior to describing a lock-opening/closing mechanism of the lid-opening/closing device 1, the locking mechanism of a pod 70 will be described. FIG. 7 is a bottom view of a pod the lid portion of which is opened and closed by the lid-opening/closing device of FIG. 4, and FIGS. 8A and 8B include enlarged views of a locking mechanism of the pod of FIG. 7. As depicted in FIG. 7, in the pod 70, a plurality of locking mechanisms 74 are provided at the bottom portion of the container body 71. More specifically, the locking mechanisms 74 are provided at the bottom portion of the container body 71 so that a pair thereof are located at the bottom portion of the side wall on the front side of the container body 71 and another pair thereof are located at the bottom portion of the side wall on the rear side of the container body 71. The locking mechanisms 74 lock and unlock the lid portion 72 with respect to the container body 71.

Figure 8A:
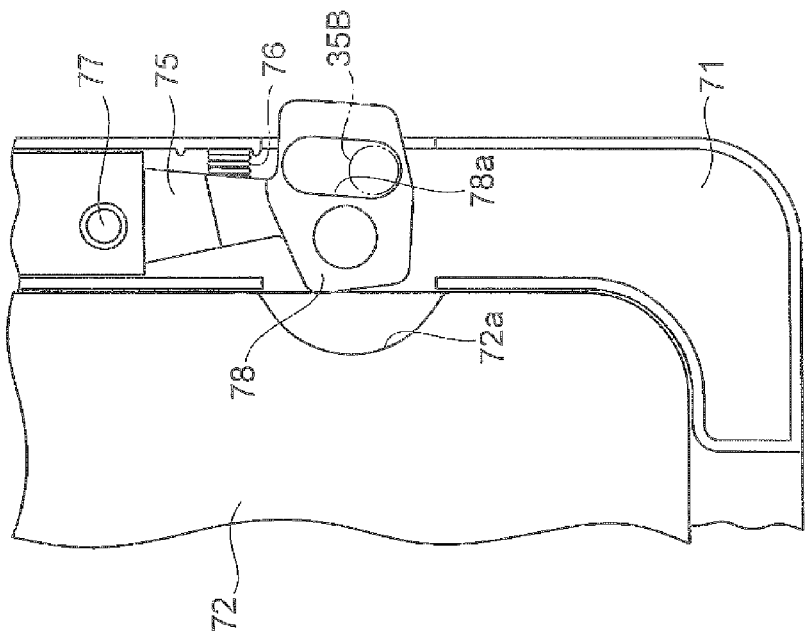
FIGS. 8A and 8B include enlarged views of a locking mechanism of the pod of FIG. 7.
Figure 8B:
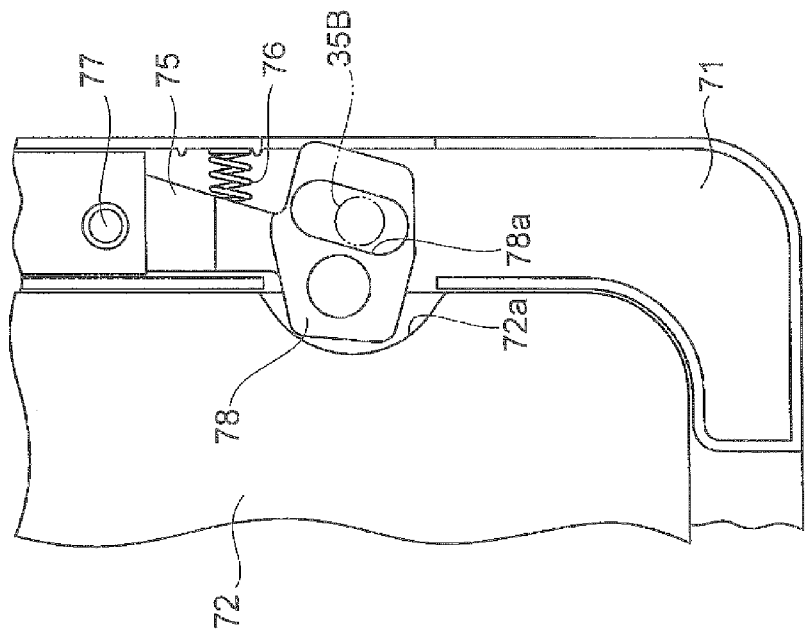

As depicted in FIGS. 8A and 8B, each locking mechanism 74 preferably includes an arm 75 and a biasing member 76 such as a compression spring, for example. The base-end portion of the arm 75 is pivotally supported by a shaft 77 in a rotatable manner on the bottom portion of the container body 71. The leading-end portion of the arm 75 is provided with an engaging portion 78. The engaging portion 78 engages with a notch 72a provided to the lid portion 72. The notch 72a is provided in plurality to the lid portion 72 so as to correspond to the engaging portion 78 of each locking mechanism 74, and is open to the side of the corresponding engaging portion 78 and to the lower side. The engaging portion 78 is provided with a recessed portion 78a that has an elongated hole shape and is open to the lower side. Each of engaging portions 35A to 35D of the lid-opening/closing device 1, described later, engages with this recessed portion 78a.

The biasing member 76 is arranged between the container body 71 and the arm 75, and biases the arm 75 so that the engaging portion 78 engages with the notch 72a. Accordingly, when a pod 70 is conveyed to the lid-opening/closing device 1, the engaging portion 78 is engaged with the notch 72a, so that the locking mechanism 74 is put in the locked state (see FIG. 8A). In contrast, when the lid portion 72 is attached to and detached from the container body 71, the engaging portion 78 is disengaged from the notch 72a, so that the locking mechanism 74 is put in the unlocked state (see FIG. 8B). In this manner, the locking mechanism 74 locks and unlocks the lid portion 72 with respect to the container body 71. It should be noted that the above-described configuration of the locking mechanism 74 is merely one example, and another configuration may be used as long as it can lock and unlock the lid portion 72 with respect to container body 71 in a pod having a configuration according to the SEMI standard, for example.

Figure 9:
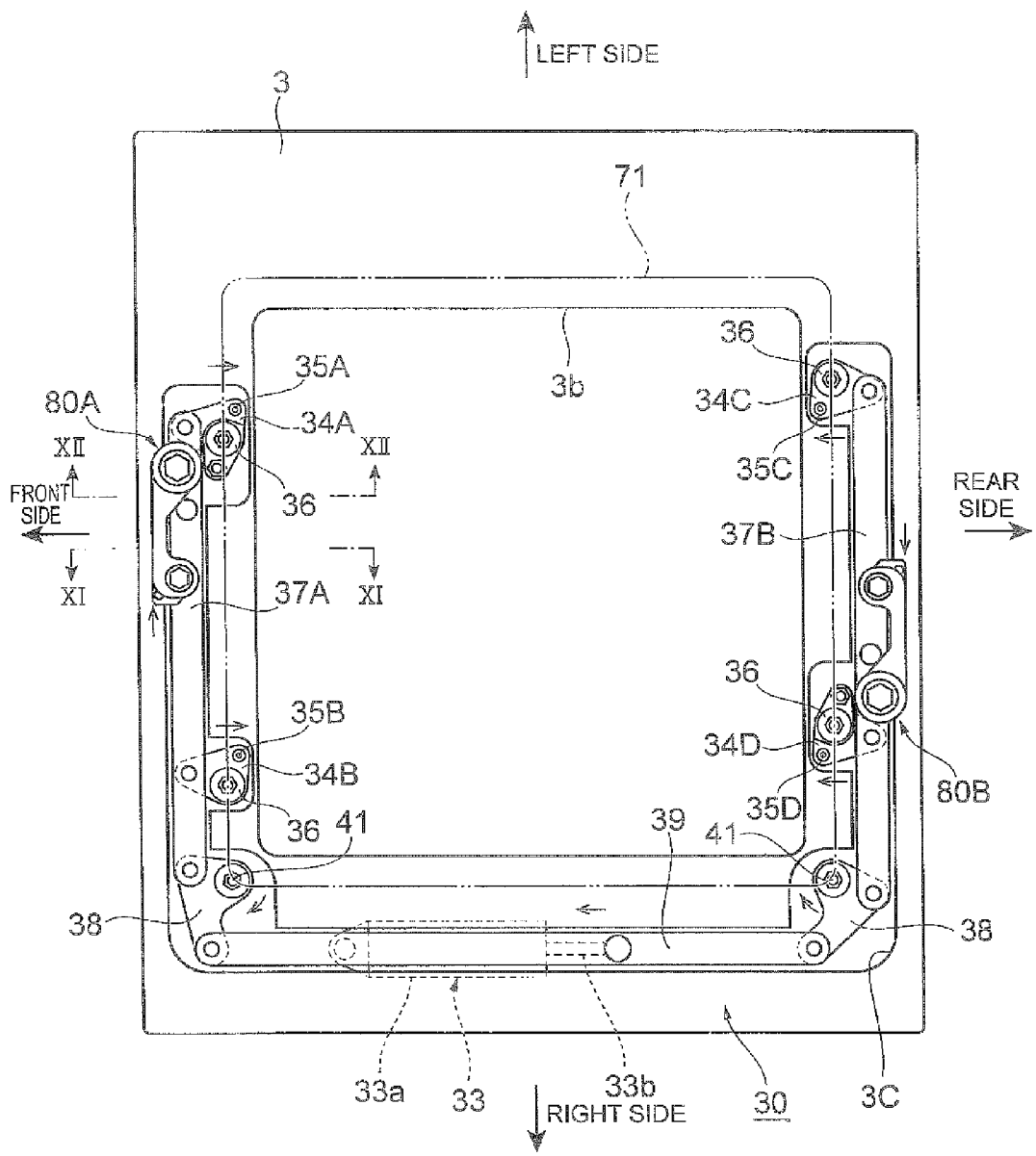
FIG. 9 is a sectional view of the lid-opening/closing device along line IX-IX of FIG. 4.

The following describes the lock-opening/closing mechanism of the lid-opening/closing device 1. FIG. 9 is a sectional view of the lid-opening/closing device along line IX-IX of FIG. 4. As depicted in FIG. 9, the lock-opening/closing mechanism (moving unit) 30 is preferably provided in a recessed portion 3c that is provided to the upper wall 3. The recessed portion 3c extends in a circumference of the opening 3b so as to extend from front-side portion to rear-side portion via right-side portion.

The lock-opening/closing mechanism 30 preferably includes plate-shaped first rotating members 34A, 34B, 34C, and 34D, engaging portions 35A, 35B, 35C, and 35D such as latch pins, plate-shaped first connecting members 37A and 37B, a pair of second rotating members 38 that preferably are plate-shaped, a plate-shaped second connecting member 39, and an air cylinder (actuator) 33. The first rotating members 34A to 34D are rotatably supported by respective bearings 36 on the bottom surface of the recessed portion 3c. The first rotating members 34A to 34D each are arranged so as to face each locking mechanism 74 of a pod 70 in the vertical direction when the pod 70 is placed on the placement surface 10 of the lid-opening/closing device 1.

In the first rotating members 34A and 34B on the front side (i.e., located on the front side of the lid portion 72 when a pod 70 is placed on the placement surface 10), the engaging portions 35A and 35B are installed upright on the respective upper surfaces of the first rotating members 34A and 34B at positions on the left side of the bearings 36. On the lower surface of the first rotating member 34A on the front side, a spring-engaging portion 42A is installed upright at a position on the right side of the bearing 36. In the first rotating members 34C and 34D on the rear side (i.e., located on the rear side of the lid portion 72 when a pod 70 is placed on the placement surface 10), the engaging portions 35C and 35D are installed upright on the respective upper surfaces of the first rotating members 34C and 34D at positions on the right side of the bearings 36. On the lower surface of the first rotating member 34D on the rear side, a spring-engaging portion 42D is installed upright at a position on the left side of the bearing 36.

The first connecting member 37A on the front side preferably is a rod-shaped member extending in the right-to-left direction in the front-side portion of the recessed portion 3c, and is rotatably attached to the respective first rotating members 34A and 34B in a pair on the front side, at positions on the front side of the bearings 36. In this manner, the first connecting member 37A on the front side connects the pair of the first rotating members 34A and 34B on the front side to rotate the first rotating members 34A and 34B. The first connecting member 37B on the rear side is a rod-shaped member extending in a right-to-left direction in the rear-side portion of the recessed portion 3c, and is rotatably attached to the respective first rotating members 34C and 34D in a pair on the rear side, at positions on the rear side of the bearings 36. In this manner, the first connecting member 37B on the rear side connects the pair of the first rotating members 34C and 34D on the rear side to rotate the first rotating members 34C and 34D.

The respective second rotating members 38 in a pair are rotatably supported by bearings 41 on the bottom surface of the recessed portion 3c. To the second rotating member 38 on the front side, the right-side end portion of the first connecting member 37A on the front side is rotatably attached at a position on the front side of the bearing 41. In this manner, the first connecting member 37A on the front side is connected to the second rotating member 38 on the front side. To the second rotating member 38 on the rear side, the right-side end portion of the first connecting member 37B on the rear side is rotatably attached at a position on the rear side of the bearing 41. In this manner, the first connecting member 37B on the rear side is connected to the second rotating member 38 on the rear side.

The second connecting member 39 preferably is a rod-shaped member extending in the front-to-rear direction in the right-side portion of the recessed portion 3c, and is rotatably attached to the respective second rotating members 38 in a pair at positions on the right side of the bearings 41. In this manner, the second connecting member 39 connects the pair of the second rotating members 38 to rotate the second rotating members 38.

The air cylinder 33 is an actuator configured to impart a driving force to the first connecting members 37A and 37B, and is arranged on the lower side of the second connecting member 39. The air cylinder 33 includes a cylinder portion 33a that is rotatably attached to the device body 2 and a rod portion 33b the base-end portion of which is inserted in the cylinder portion 33a. The leading-end portion of the rod portion 33b is rotatably attached to a middle portion of the second connecting member 39.

Figure 10:
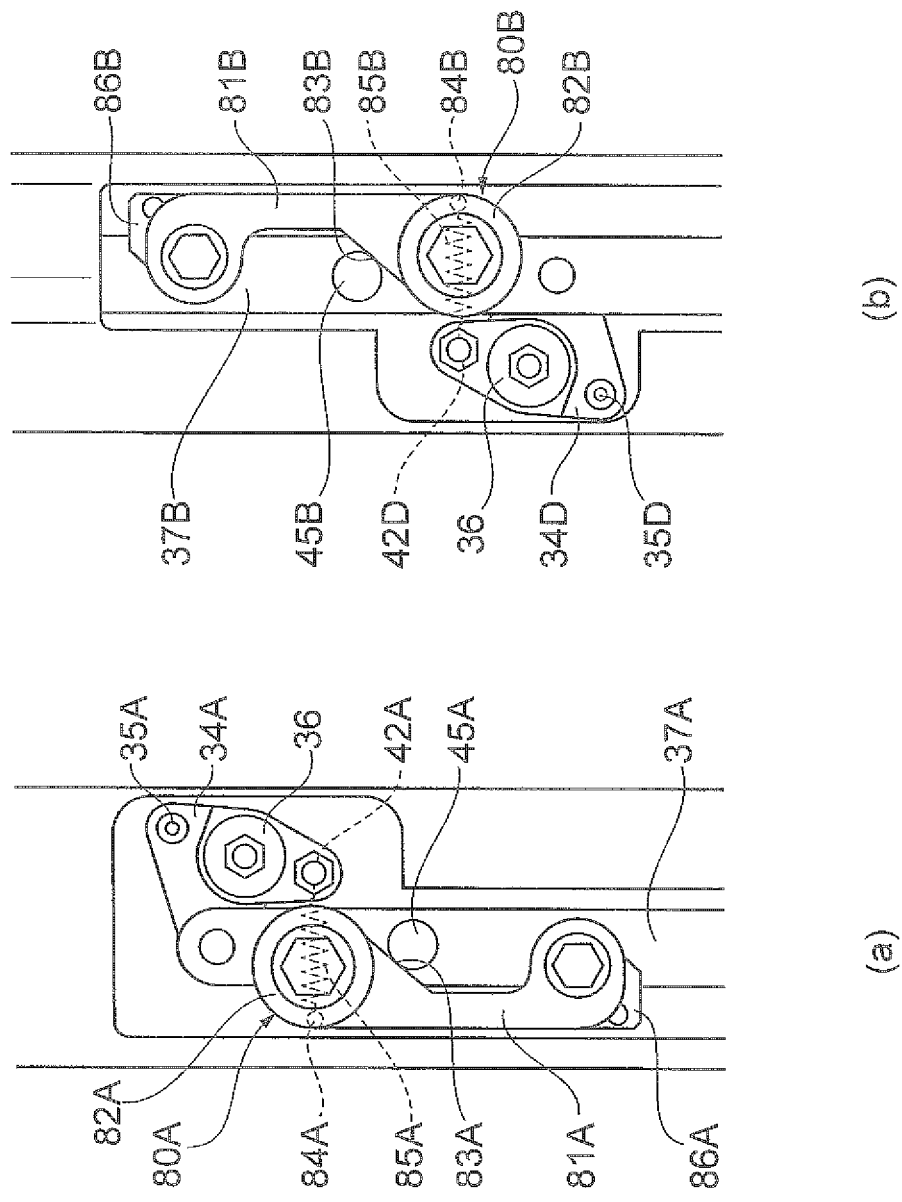
FIG. 10 includes enlarged sectional views around a container-securing unit.
Figure 11:
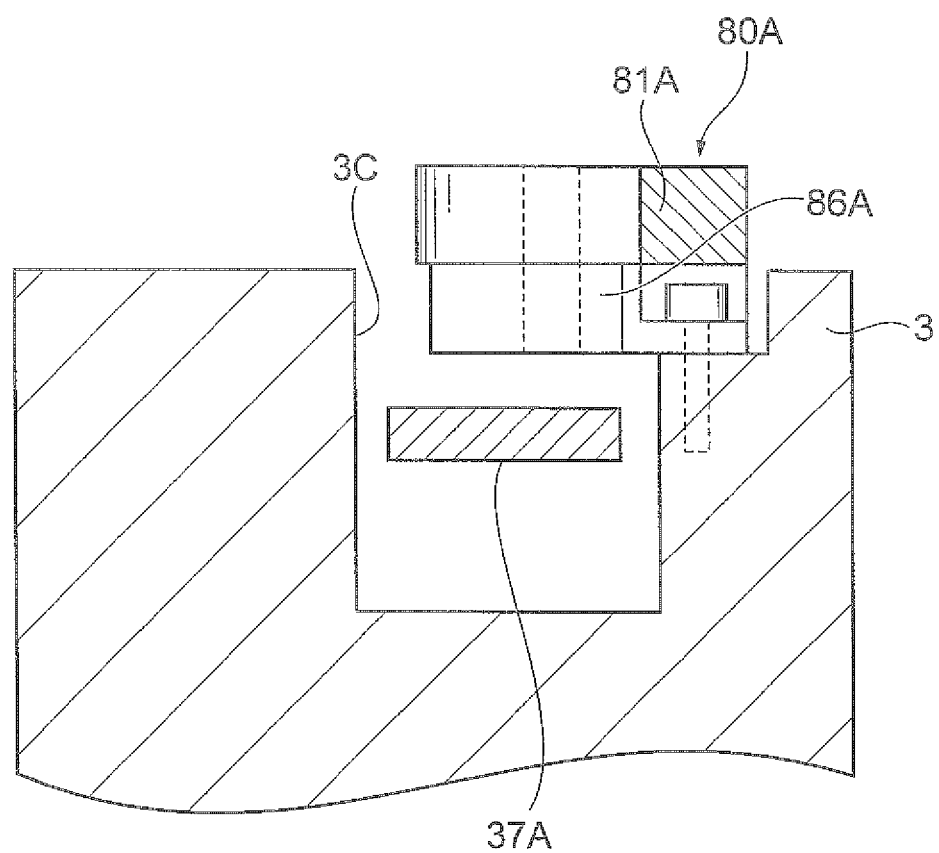
FIG. 11 is a sectional view along line XI-XI in FIG. 9.

As depicted in FIG. 9, a container-securing unit 80A is provided near an edge portion on the front side of the upper wall 3. Similarly, a container-securing unit 80B is provided near an edge portion on the rear side of the upper wall 3. The following describes details of the container-securing units 80A and 80B. FIG. 10 includes enlarged sectional views around the container-securing units, FIG. 10A illustrates the container-securing unit provided on the front side, and FIG. 10B illustrates the container-securing unit provided on the rear side. FIG. 11 is a sectional view along line XI-XI in FIG. 9, and FIG. 12 is a sectional view along line XII-XII in FIG. 9.

Figure 12:
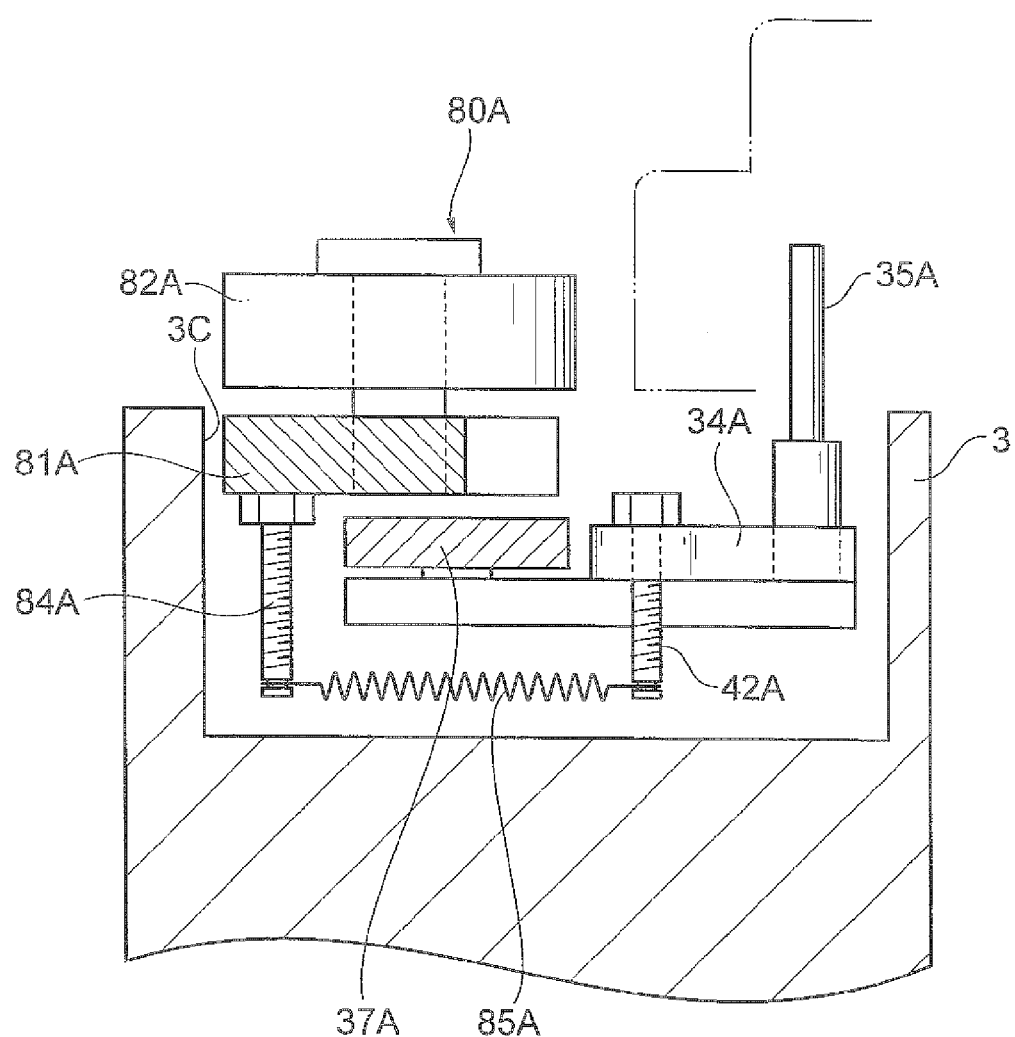
FIG. 12 is a sectional view along line XII-XII in FIG. 9.

As depicted in FIGS. 10A, 11, and 12, the container-securing unit 80A includes a lever portion 81A, an elastic roller (pressing member) 82A, a spring-engaging portion 84A, and a spring (biasing member) 85A. The base-end side of the lever portion 81A is connected to the upper wall 3 with a spacer 86A interposed therebetween. The spacer 86A extends from near an edge portion on the front side of the upper wall 3 to above the first connecting member 37A, and is rotatably connected to the base-end side of the lever portion 81A above the first connecting member 37A. The connecting portion between the lever portion 81A and the spacer 86A is located approximately in the middle of the opening 3b in the right-to-left direction. The leading end of the lever portion 81A extends toward the left side.

The elastic roller 82A is rotatably attached to the upper surface of the leading-end side of the lever portion 81A, and is configured to elastically abut the circumferential surface of the container body 71. The spring-engaging portion 84A is installed upright on the lower surface of the leading end of the lever portion 81A. One end of the spring 85A is engaged with the spring-engaging portion 42A that is installed upright on the lower surface of the first rotating member 34A, and the other end is engaged with the spring-engaging portion 84A. The spring 85A biases both of the spring-engaging portion 42A and the spring-engaging portion 84A in the direction of bringing them closer to each other.

The upper surface of the first connecting member 37A is provided with a cam follower (linkage member) 45A that is configured to abut on and separate from the lever portion 81A when the first connecting member 37A moves. The lever portion 81A is provided with a cam surface 83A in a position of abutting the cam follower 45A. The abutting of the cam follower 45A on the cam surface 83A rotates the lever portion 81A so that the leading-end side of the lever portion 81A (on the side of the elastic roller 82A) moves away from the opening 3b. Specifically, when the first connecting member 37A slides to the left side, the cam follower 45A abuts the cam surface 83A, and the cam follower 45A pushes the cam surface 83A to the front side, thus rotating the lever portion 81A. Conversely, when the first connecting member 37A slides to the right side, the cam follower 45A separates from the cam surface 83A, and the lever portion 81A rotates so that the leading-end side of the lever portion 81A is moved to the side of the opening 3b by a biasing force of the spring 85A.

Similarly to the container-securing unit 80A, the container-securing unit 80B includes, as depicted in FIG. 10B, a lever portion 81B, an elastic roller (pressing member) 82B, a spring-engaging portion 84B, and a spring (biasing member) 85B. The base-end side of the lever portion 81B is connected to the upper wall 3 with a spacer 86B interposed therebetween. The spacer 86B extends from near an edge portion on the rear side of the upper wall 3 to above the first connecting member 37B, and is rotatably connected to the base-end side of the lever portion 81B above the first connecting member 37B. The connecting portion between the lever portion 81B and the spacer 86B is located approximately in the middle of the opening 3b in the right-to-left direction. The leading end of the lever portion 81B extends toward the right side.

The elastic roller 82B is rotatably attached to the upper surface of the leading-end side of the lever portion 81B, and is configured to elastically abut the circumferential surface of the container body 71. The spring-engaging portion 84B is installed upright on the lower surface of the leading end of the lever portion 81B. One end of the spring 85B is engaged with the spring-engaging portion 42D that is installed upright on the lower surface of the first rotating member 34D, and the other end is engaged with the spring-engaging portion 84B. The spring 85B biases both of the spring-engaging portion 42D and the spring-engaging portion 84B in the direction of bringing them closer to each other.

The upper surface of the first connecting member 37B is provided with a cam follower (linkage member) 45B that is configured to abut on and separate from the lever portion 81B when the first connecting member 37B moves. The lever portion 81B is provided with a cam surface 83B in a position of abutting the cam follower 45B. The abutting of the cam follower 45B on the cam surface 83B rotates the lever portion 81B so that the leading-end side of the lever portion 81B (on the side of the elastic roller 82B) moves away from the opening 3b. Specifically, when the first connecting member 37B slides to the right side, the cam follower 45B abuts the cam surface 83B, and the cam follower 45B pushes the cam surface 83B to the rear side, thus rotating the lever portion 81B. Conversely, when the first connecting member 37B slides to the left side, the cam follower 45B separates from the cam surface 83B, and the lever portion 81B rotates so that the leading-end side of the lever portion 81B is moved to the side of the opening 3b by a biasing force of the spring 85B.

As depicted in FIG. 5, the respective engaging portions 35A to 35D protrude upward through respective openings 3e each preferably having an elongated hole shape and provided in plurality to a top panel portion 3d that defines a portion of the upper wall 3 and covers the recessed portion 3c. The container-securing units 80A and 80B protrude upward through respective openings 3f and 3g provided to the top panel portion 3d. Accordingly, when a pod 70 is placed on the placement surface 10 of the lid-opening/closing device 1, with the recessed portion 78a of each locking mechanism 74 of the pod 70, each vertically facing one of the engaging portions 35A to 35D engages. The respective elastic rollers 82A and 82B of the container-securing units 80A and 80B face the circumferential surface of the container body 71.

The following describes unlocking operation of the lock-opening/closing mechanism 30 to cause the locking mechanisms 74 of the pod 70 to perform unlocking. As depicted in FIG. 5, the lock-opening/closing mechanism 30 stands by with the engaging portions 35A to 35D positioned on the inner side (i.e., on the side of opening 3b) in the respective openings 3e each preferably having an elongated hole shape and provided to the top panel portion 3d and with the elastic roller 82A of the container-securing unit 80A and the elastic roller 82B of the container-securing unit 80B positioned on the outer side (i.e., on the side away from the opening 3b). At this time, the first connecting members 37A and 37B, the second connecting member 39, and the air cylinder 33 of the lock-opening/closing mechanism 30 are in a state depicted in FIG. 9. In this state, when a pod 70 is placed on the placement surface 10 of the lid-opening/closing device 1, with the recessed portion 78a of each locking mechanism 74 that is in the locked state in the pod 70 (see FIG. 8A), each vertically facing one of the engaging portions 35A to 35D engages.

Figure 13:
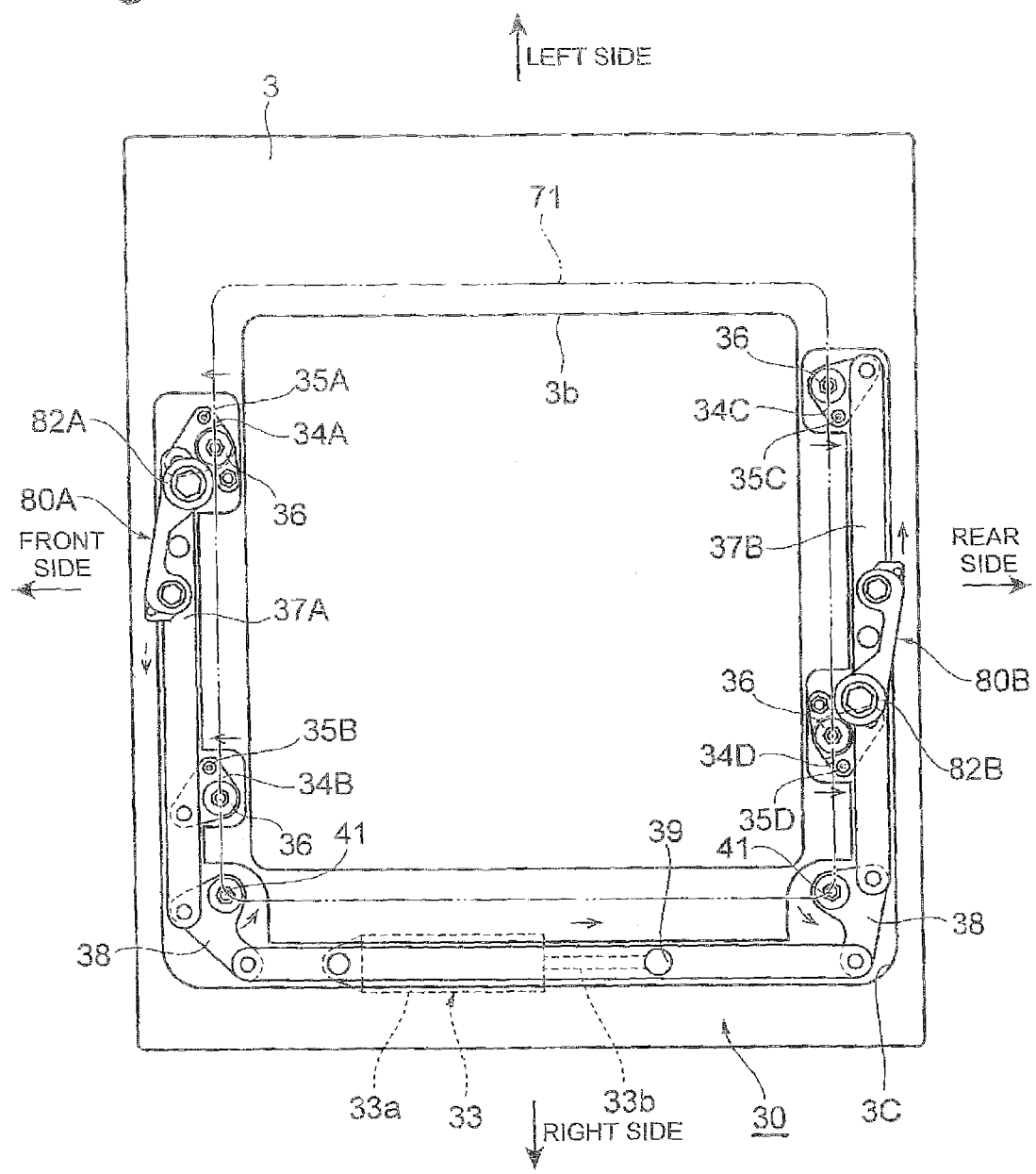
FIG. 13 is a sectional view of the lid-opening/closing device of FIG. 9 in another state.

Subsequently, as depicted in FIG. 13, in the lock-opening/closing mechanism 30, the rod portion 33b is slid to the rear side by charging or discharging gas into or from the cylinder portion 33a. This rotates the second rotating member 38 on the front side counterclockwise in plan view, thus moving the first connecting member 37A on the front side to the right side. Furthermore, the first rotating members 34A and 34B on the front side are rotated counterclockwise in plan view, such that the engaging portions 35A and 35B are moved to the front side. Meanwhile, the second rotating member 38 on the rear side is rotated counterclockwise in plan view, such that the first connecting member 37B on the rear side is moved to the left side. Furthermore, the pair of the first rotating members 34C and 34D on the rear side are rotated counterclockwise in plan view, such that the engaging portions 35A to 35D are moved to the rear side. In other words, in the respective openings 3e each having an elongated hole shape and provided to the top panel portion 3d, the engaging portions 35A to 35D are positioned in the outer side (i.e., on the side opposite to the opening 3b). Accordingly, in each locking mechanism 74 of the pod 70, the engaging portion 78 is removed from the recessed portion 72a, such that each locking mechanism 74 is put into the unlocked state (see FIG. 8B), and the lid portion 72 is removed from the container body 71.

The first connecting member 37A on the front side is moved to the right side, and the first rotating member 34A is rotated counterclockwise in plan view, such that the leading-end side (the side in which the elastic roller 82A is attached) of the lever portion 81A is moved to the side of opening 3b by a biasing force of the spring 85A engaged with the spring-engaging portion 42A. At this time, the cam follower 45A separates from the cam surface 83A, thus allowing the leading-end side of the lever portion 81A to move to the side of the opening 3b. Meanwhile, the first connecting member 37B on the rear side is moved to the left side, and the first rotating member 34D is rotated counterclockwise in plan view, such that the leading-end side (the side in which the elastic roller 82B is attached) of the lever portion 81B is moved to the side of opening 3b by a biasing force of the spring 85B engaged with the spring-engaging portion 42D. At this time, the cam follower 45B separates from the cam surface 83B, thus allowing the leading-end side of the lever portion 81B to move to the side of the opening 3b.

In other words, the elastic rollers 82A and 82B are moved to the side of the opening 3b in conjunction with the unlocking operation of the lock-opening/closing mechanism 30, such that the circumferential surface of the container body 71 is caught in between the elastic rollers 82A and 82B, and thus the container body 71 is secured with respect to the device body 2. The securing of the container body 71 with the elastic rollers 82A and 82B is performed by the biasing forces of the springs 85A and 85B. Thus, even if variations occur in the size of the container body 71, the container body 71 is appropriately and reliably secured.

The following describes locking operation of the lock-opening/closing mechanism 30 to cause the locking mechanisms 74 of the pod 70 to perform locking. The lock-opening/closing mechanism 30 stands by with the engaging portions 35A to 35D positioned on the outer side (i.e., on the side opposite to the opening 3b) in the respective openings 3e each preferably having an elongated hole shape and provided to the top panel portion 3d. At this time, the first connecting members 37A and 37B, the second connecting member 39, and the air cylinder 33 of the lock-opening/closing mechanism 30 are in a state depicted in FIG. 13. With the recessed portion 78a of each locking mechanism 74 that is in the unlocked state in the pod 70 (see FIG. 8B), each vertically facing one of the engaging portions 35A to 35D engages.

In this state, when the lid portion 72 is attached to the container body 71, as depicted in FIG. 9, in the lock-opening/closing mechanism 30, the rod portion 33b is slid to the front side by charging or discharging gas into or from the cylinder portion 33a. This rotates the second rotating member 38 on the front side clockwise in plan view, thus moving the first connecting member 37A on the front side to the left side. Furthermore, the pair of the first rotating members 34A and 34B on the front side are rotated clockwise in plan view, such that the engaging portions 35A and 35B are moved to the rear side. Meanwhile, the second rotating member 38 on the rear side is rotated clockwise in plan view, such that the first connecting member 37B on the rear side is moved to the right side. Furthermore, the pair of the first rotating members 34C and 34D on the rear side are rotated clockwise in plan view, such that the engaging portions 35C and 35D are moved to the front side. In other words, as depicted in FIG. 5, in the respective openings 3e each preferably having an elongated hole shape and provided to the top panel portion 3d, the engaging portions 35A to 35D are positioned in the inner side (i.e., on the side of the opening 3b). Accordingly, in each locking mechanism 74 of the pod 70, the engaging portion 78 engages with the recessed portion 72a, such that each locking mechanism 74 is put into the locked state (see FIG. 8A).

The first connecting member 37A on the front side is moved to the left side, and the first rotating member 34A is rotated clockwise in plan view, such that the biasing of the spring 85A acting on the leading-end side (the side in which the elastic roller 82A is attached) of the lever portion 81A is released. At the same time, when the first connecting member 37A is moved to the left side, the cam follower 45A abuts the cam surface 83A of the container-securing unit 80A, and the cam follower 45A pushes the leading-end side of the lever portion 81A in a direction against the biasing force of the spring 85A (to the front side). This releases the securing of the container body 71 by the elastic roller 82A. Meanwhile, the first connecting member 37B on the rear side is moved to the right side, and the first rotating member 34D is rotated clockwise in plan view, such that biasing of the spring 85B acting on the leading-end side (the side in which the elastic roller 82B is attached) of the lever portion 81B is released. At the same time, when the first connecting member 37B is moved to the right side, the cam follower 45B abuts the cam surface 83B of the container-securing unit 80B, and the cam follower 45B pushes the leading-end side of the lever portion 81B in a direction against the biasing force of the spring 85B (to the rear side). This releases the securing of the container body 71 by the elastic roller 82B.

As described above, in the lid-opening/closing device 1, when the unlocking of the locking mechanisms 74 of the pod 70 is performed by moving the first connecting members 37A and 37B, for example, of the lock-opening/closing mechanism 30, the container-securing units 80A and 80B secure the container body 71 to the device body 2 in conjunction with the first connecting members 37A and 37B. Because the container body 71 is secured to the device body 2 in conjunction with the unlocking operation of the locking mechanism 74 in this manner, for example, even if the lid portion 72 is attached when the locking mechanism 74 is in the unlocked state, lifting of the container body 71 and positional misalignment of the lid portion 72, for example, is prevented from occurring. Thus, this lid-opening/closing device 1 enables the lid portion 72 to be accurately attached to the container body 71.

The first rotating members 34A to 34D are provided with the engaging portions 35A to 35D, respectively, and the first rotating members 34A to 34D are connected with the first connecting members 37A and 37B, the second rotating members 38, and the second connecting member 39. This enables the engaging portions 35A to 35D provided to the first rotating members 34A to 34D to be simultaneously operated. Accordingly, the unlocking operation and the locking operation of the locking mechanisms 74 that are provided corresponding to the engaging portions 35A to 35D are performed simultaneously. This prevents the occurrence of lifting of the container body 71 and positional misalignment of the lid portion 72, for example, due to variations in the unlocking operation and the locking operation of the locking mechanisms 74. Thus, this lid-opening/closing device 1 enables the lid portion 72 to be more accurately attached to the container body 71.

When the container body 71 is secured by the container-securing units 80A and 80B, the elastic rollers 82A and 82B are pressed against the container body 71 by using the biasing force of the springs 85A and 85B, which eliminates the necessity of special actuators, for example, to secure the container body 71, and thus the device configuration is greatly simplified.

By configuring the lever portions 81A and 81B of the container-securing units 80A and 80B to be rotatable and rotating the lever portions 81A and 81B by the cam followers 45A and 45B, operation of pressing the elastic rollers 82A and 82B against the container body 71 and operation of releasing this pressing preferably is performed in conjunction with the movement of the first connecting members 37A and 37B. This eliminates the necessity of special actuators, for example, for rotating the lever portions 81A and 81B, and thus the device configuration is capable of being simplified and power savings are achieved.

One preferred embodiment of the present invention has been described above, but the present invention is not limited to the above-described preferred embodiment. For example, the target for the lid-opening/closing device of the present invention is not limited to the pod 70 that stores therein a reticle R, and may be another storage container that stores therein another object to be stored. As an actuator that imparts a driving force to the lock-opening/closing mechanism 30, an actuator other than the air cylinder 33 may be used. As shapes or materials in all configurations described above, not limited to those described above, various shapes or materials can be used. The connecting members of various preferred embodiments of the present invention are not limited to the above-described rod-shaped members. Even if the connecting members are other types of connecting members such as wires, an operation mechanism similar to those described above can be implemented. The unlocking operation and the locking operation of the lock-opening/closing mechanism 30 can be performed even when the rotating directions of the rotating members 34A to 34D and 38 and the moving directions of the connecting members 37A, 37B, and 39 are reversed from the above-described case.

One aspect of various preferred embodiments of the present invention enables a lid-opening/closing device to be provided that accurately attaches a lid portion to a container body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A lid-opening/closing device for a storage container provided with a container body storing therein an object to be stored, a lid portion defining a bottom portion that is openable and closable with respect to the container body and on which an object to be stored is placed, and a locking mechanism configured to perform unlocking and locking of the lid portion with respect to the container body, the lid-opening/closing device being configured to open and close the lid portion with respect to the container body and comprising:

a device body on which the storage container is placed;
a moving unit that includes an engaging portion configured to engage with the locking mechanism when the storage container is placed on the device body, and configured to perform an unlocking operation to cause the locking mechanism to perform the unlocking and a locking operation to cause the locking mechanism to perform the locking by moving the engaging portion; and a container-securing unit configured to secure the container body to the device body in conjunction with the moving unit when the locking mechanism is caused to perform the unlocking; wherein the moving unit further includes:
- a plurality of rotating members each of which: includes the engaging portion, is rotatably supported by the device body, and is configured to move the engaging portions;
- a connecting member configured to connect at least a pair of the rotating members and rotate the pair of rotating members; and
- an actuator that is attached to the device body and is configured to impart a driving force to the connecting member;

the container-securing unit is linked with movement of the connecting member;

the container-securing unit includes a pressing member configured to press the container body and a biasing member configured to bias the pressing member toward the container body; and the moving unit includes a linkage member configured to separate the pressing member from the container body in a direction against a biasing force of the biasing member when the locking operation is performed, and is configured to allow the biasing member to bias the pressing member when the unlocking operation is performed.

2. The lid-opening/closing device according to claim 1, wherein the container-securing unit includes a lever portion including a base-end side rotatably supported by the device body and a leading-end side that is movable;

the pressing member includes an elastic roller configured to elastically abut the container body and be rotatably attached to the leading-end side of the lever portion;

the biasing member includes a spring configured to bias the leading-end side of the lever portion; and the linkage member includes a cam follower that is fixed in a position on the connecting member where the linkage member is capable of abutting on and separating from the lever portion in connection with the movement of the connecting member and rotates the lever portion.

* * * * *